United States Patent [19]

Leitner et al.

[11] 4,070,500

[45] Jan. 24, 1978

[54] RADIATION-CURABLE COMPOSITIONS AND METHOD OF COATING THEREWITH

[75] Inventors: Roland L. Leitner, Somerset; Gerald I. Nass, Secaucus; Phillip Adams, Murray Hill; Marvin Weiss, New Providence, all of N.J.

[73] Assignee: Millmaster Onyx Corporation, New York, N.Y.

[21] Appl. No.: 650,937

[22] Filed: Jan. 21, 1976

[51] Int. Cl.² ............................................. B05D 3/06
[52] U.S. Cl. .................................. 427/54; 96/115 P; 204/159.14; 204/159.21; 260/64
[58] Field of Search ................... 260/828, 64, 837 R; 204/159.21, 159.14; 427/54, 44, 43; 96/115 P, 115 R

[56] References Cited

U.S. PATENT DOCUMENTS

| | | |
|---|---|---|
| 2,634,249 | 4/1953 | Vogelsang ........................... 260/828 |
| 3,375,229 | 3/1968 | Borden et al. ........................ 260/64 |
| 3,427,161 | 2/1969 | Laridon et al. ....................... 427/54 |
| 3,632,493 | 1/1972 | Rogers ................................. 427/54 |
| 3,808,288 | 4/1974 | Hackhel .............................. 260/828 |
| 3,867,142 | 2/1975 | Krause ............................ 204/159.21 |

OTHER PUBLICATIONS

Ferguson, *Textbook of Organic Chemistry,"* pp. 199–201, D. Van Nostrand Co., Inc., New York, (1958).

*Primary Examiner*—John H. Newsome
*Attorney, Agent, or Firm*—Arthur A. Jacobs

[57] ABSTRACT

Radiation-curable vehicles, and compositions containing such vehicles, for use in inks, paints, coatings, or similar compositions, such vehicles being operative without the inclusion of photo-initiators or photo-decomposible materials to accelerate the cure, and comprising condensation products of aldehydes and ketones, and such compositions being substantially free of acrylic or allylic moieties.

13 Claims, No Drawings

RADIATION-CURABLE COMPOSITIONS AND METHOD OF COATING THEREWITH

This invention relates to radiation-curable compositions, and it particularly relates to radiation-curable inks, paints, coatings, or the like.

Film-forming vehicles that are curable by exposure to some form of high-energy radiation have, heretofore, been known. These vehicles form the bases for quick-cure compositions that eventuate into inks, paints, coatings, etc. In view of the use of radiation for curing, apparatus for evaporating volatile solvents and for baking the residue are not required. In this manner, by using photo-curable materials, it is possible to reduce the cost of equipment, and to comply more easily with ecological requirements regarding harmful volatile solvents.

Since vehicles which cure rapidly upon exposure to radiation are often materials of low, or marginal, stability even before exposure, an inhibitor is customarily included in the quick-cure composition, such inhibitor being designed for the purpose of preventing polymerization before, but not after, exposure. In order to increase the cure rate after exposure, the compositions are usually provided with a photo-initiator or sensitizer whose purpose is to catalyse polymerization after exposure to some form of high-energy radiation. Such photo-initiators are usually materials which function by being decomposed by the high-energy radiation, the decomposition products being particles of high enough energy to initiate polymerization.

In addition to inhibitors and sensitizers, and depending on the purpose for which the cured film is intended or the effect that is to be created, oils, waxes, resins, varnishes, colorants, diluents, solvents, extenders, etc. may be added to the composition to provide the cured film with the particular properties desired.

Most of the heretofore-known radiation-curable compositions have contained ethylenically unsaturated groups or their derivatives as the active moieties. More specifically, they have contained at least one molecular or polymolecular component which has at least one very active ethylenically-unsaturated group. These ethylenically-unsaturated groups are most often present in the form of acrylic acid, or in chemical compounds which are homologs and derivatives of acrylic acid. Allyl derivatives have also been used as a source of unsaturation. The ability of these ethylenically-unsaturated materials to quick-cure is due to their ability to polymerize and cross-link into hard, thin films upon exposure to radiation.

It is obviously an advantage to use such quick-cure compositions in the manufacture of inks, paints, coatings, and the like. However, they have, heretofore, been subject to a number of serious shortcomings. In this respect, since the synthesis of unsaturated monomers or the chemical grafting of unsaturated moieties to other substances is often an expensive process, the cost of producing a polymerizable vehicle may be comparatively high.

Another problem heretofore encountered was that the unsaturated polymerizable materials were frequently toxic and, in the instances when the vehicles were made from substances to which ethylenic materials were chemically grafted, some of the lower molecular weight unsaturated monomer often remained in the vehicle as a toxic impurity.

A third problem was that photo-initiators or inhibitors tended to become troublesome in industrial applications. This was due to the fact that they were usually compounds of relatively low molecular weight, whereby they often possessed a solvent power which caused softening, decomposition, or the destruction of certain susceptible materials such as rubber, plastics, and the like that are often to be found in machines or equipment in commercial use. An example of such equipment is a printing press which is used to apply or deposit the photo-curable composition onto a substrate.

A fourth problem was that the quick-cure vehicles often did not have the proper hydrophyllic-hydrophobic balance for use in processes that require a large volume of water, such as, for example, in lithography. Consequently, they could not be used in quick-cure compositions, such as inks, which are used in processes demanding a substantial quantity of water.

It is an object of the present invention to overcome the above and other disadvantages by providing stable, inexpensive, nontoxic film formers adapted for use in compositions which are readily cured by high-energy radiation, such as ultraviolet light.

It is another object of the present invention to formulate compositions of the aforesaid type which are operative without inhibitors or photo-initiators.

It is a further object of the present invention to formulate compositions of the aforesaid type which can be used satisfactorily in processes that require large volumes of water, as, for example, in lithography.

Other objects will become apparent from the following description and claims.

In accordance with the present invention, it has been discovered that there are film-forming materials which can be cured rapidly upon exposure to high-energy radiation, such as ultraviolet light, without the addition of photo-initiators; yet these materials are so stable in the absence of high-energy radiation that they have an indefinitely long shelf-life, whether alone or in formulated compositions, even in the absence of inhibitors. These materials are, furthermore, relatively non-toxic and, some have, indeed, been governmentally-approved for use in food packaging.

It has, in addition, been discovered that the aforesaid materials can be used to formulate radiation-curable compositions which have the proper hydrophyllic-hydrophobic balance so that they can be used in processes that require a large quantity of water, for example, as in lithography.

The aforesaid materials and the formulated compositions in which they may be embodied, although curable by radiation, need not contain such ethylenically-unsaturated moieties as are found in acrylates and their derivatives or homologs, nor need they contain any allyl groups or their derivatives or homologs.

Another surprising property of these materials is that they may be dissolved or dispersed, within certain wide limits, in one or more liquid extenders, and the entire liquid composition is curable, upon exposure to high-energy radiation such as ultraviolet light, without the necessity of evaporating the liquid extender or removing it by any other means, even when the liquid extender is present in relatively high concentration. As a consequence, it is possible to use liquid extenders of relatively high boiling point and low vapor pressure in these quick-cure compositions. Since the extender need not be evaporated, the entire composition, including the extender, is cured to a non-tacky film after exposure to the proper intensity of radiation even when, as in some cases, the liquid components of the curable composition exceed 50% of the total weight.

One advantage of using extenders of comparatively low volatility, which need not be evaporated out of the composition before exposure to radiation, is that it is easier to meet the ecological requirements if vapors need not be expelled into the atmosphere.

Another possible advantage of keeping the liquid extenders in the cured film is that it makes it easier to vary the concentration of any non-volatile liquid component, whereby films may feasibly be deposited on such varied flexible materials as paper, thin metal foil, textiles, flexible plastic film, rubber, etc., as well as on the more conventional hard, rigid surfaces.

The nature of the substrate is not a restricting consideration in most cases. The substrate may be rigid or flexible, impervious or porous, translucent or opaque to the radiation; it may also have a high or low coefficient of thermal expansion.

A primary restrictive consideration is the miscibility of the substrate in the liquid extender in a quick-cure composition. Extenders which diffuse excessively into the substrate are, generally, to be avoided.

The concentration of the liquid extender is also an important consideration. It must be such that the final composition has the proper rheological properties for use in high speed equipment, each liquid extender having its own particular range of optimum concentrations.

One embodiment of the film-forming materials suitable for the present invention is a class of resins variously referred to as either ketone resins, ketone polymers, or polyketones. In general, they are condensation products of (a) aldehydes, such as formaldehyde, and (b) ketones, as, for example, methyl ethyl ketone, methyl isobutyl ketone, cyclohexanone and methylcyclohexanone. These condensation products have very little, if any, ethylenic unsaturation, and no acrylate or allylic types of moieties. They are materials which are soluble or dispersible in a large number of extenders and can be blended with most of the solid or liquid additives that are commonly used in formulating quick-cure, radiation-sensitive, inks, paints or coatings.

The commercially available ketone resins used in the vehicles or compositions of this invention are the base-catalysed condensation products of formaldehyde with either cyclic ketones, or acyclic ketones.

The cyclic ketones that are used in manufacturing commercially available ketone resins are cyclohexanone and alkylated cyclohexanone in which the alkyl group contains from one to three carbon atoms.

The acyclic ketones used in manufacturing commercially available ketone resins are methyl ethyl ketone, and methyl isobutyl ketone.

The exact mechanism of this condensation reaction is not completely understood, but it appears that the first step in the condensation is the production of methylol derivatives of the ketone, followed by a spontaneous intermolecular dehydration to yield colorless, vitreous solids.

The reaction may be carried out by heating an aqueous mixture of one mol of ketone and about 1.5 to 2.5 moles of formaldehyde to about 75° C, then adding aqueous caustic at a rate which keeps the temperature below about 98° C.

The molecular weights of the ketone resins vary from about 500 to about 1200. The resins made from cyclic ketones ordinarily are of slightly lower molecular weight than those made from acyclic ketones. Thus, the cyclic ketone resins ordinarily have a median molecular weight of about 700–800, and the acyclic ketone resins have a median molecular weight of about 800–1000.

Some ketone resin compositions do not cure as rapidly as the fastest curable compositions containing acrylated types of film formers. However, they do cure rapidly enough upon exposure to ultraviolet light to serve as useful vehicles in commercially practical, high-speed coating or printing operations. Furthermore, the ketone resin compositions generally cure faster than compositions based on allylic types of film formers.

The slightly slower cure rate of the ketone resins, as compared to acrylate resins, may be considered as a convenience and an advantage. In this respect, since they are considerably more resistant to spontaneous cure, compositions containing ketone resins as the curable film formers have a much longer shelf-life.

Compositions containing ketone resins cure, upon exposure to high-energy radiation, to permanent films which resist ordinary abrasion. Such ketone resins are also compatible with the usual commercial extenders, and the solutions or dispersions thereof are easily blended with colorants and most of the other additives commonly used in formulating inks, paints, coatings, and the like.

The above-described ketone resin compositions may be cured on either rigid or flexible substrates, on impervious or porous surfaces, on substances which are transparent or opaque to high-energy radiation, and on substrates with high or low coefficients of thermal expansion. They may be formulated into compositions which cure under high-energy radiation, such as ultraviolet light, in the presence of an extender, so it is not necessary to remove the extender by evaporation or any other means before exposure. Such compositions can be satisfactorily used in printing processes that require a large volume of water, such as in lithography.

The aforesaid ketone resin compositions cure rapidly enough under high-energy radiation exposure to be used commercially in high speed application without requiring the presence of photo-initiators or photo-decomposible materials to accelerate the cure. Indeed, in some instances, the inclusion of an initiator has little or no effect on the cure speed, while, in other instances, the inclusion thereof actually decelerates the cure speed.

The following resins are utilizable in the present invention:

"MR 85", a cyclohexanone-formaldehyde condensate;

"MR 85D", a cyclohexanone-formaldehyde condensate that is slightly darker in color than "MR 85";

"MR 85H", a cyclohexanone-formaldehyde condensate of higher molecular weight, and higher melting point than "MR 85" or "MR 85D";

"MR 97", a methyl ethyl ketone-formaldehyde condensate;

"K 1717", a methyl ethyl ketone-formaldehyde condensate;

"K 1717HMP", a methyl ethyl ketone-formaldehyde condensate of higher molecular weight and higher melting point than "K 1717".

Resins of the "MR" series are manufactured by Mohawk Industries, Inc., Sparta, N.J. "MR 85", "MR 85D" and "MR 85H" have been approved by the Food and Drug Administration for particular uses connected with food packaging.

Resins of the "K" series are manufactured by Lawter Chemicals, Inc., Chicago, Ill.

The extenders used in this invention were:

Esters: benzyl benzoate, methyl laurate, methyl myristate, isopropyl myristate, isopropyl stearate, propyl pelargonate, butyl pelargonate, dibutyl maleate, dibutyl succinate, and diethyl adipate.

Alcohols: decanol, tridecanol, "Neodol 23" (a 12-13 carbon alcohol mixture), "Neodol 25" (a 12-15 carbon alcohol mixture), benzyl alcohol, hexylene glycol, octanol and cyclohexanol.

Aldehydes: lauric aldehyde.

Ketones: methyl undecyl ketone.

Nitrogen Heterocyclics: N-methyl pyrrolidone, N-vinyl pyrrolidone, N-decyl pyrrolidone.

Epoxides: "Epoxide #7", "Epoxide #8".

The Neodol alcohols are manufactured by Shell Chemical Co., Houston, Texas. The epoxides are manufactured by Proctor and Gamble, Cincinnati, Ohio. They are mixtures of alkyl glycidyl ethers. In "Epoxide #7" the alkyl group is predominantly n-octyl and n-decyl. In "Epoxide #8" the alkyl group is predominantly n-dodecyl and n-tetradecyl.

Other extenders that can be used are:

Esters: Diacyl esters of ethylene glycol; diformyl, diacetyl, dipropionyl, dibutyryl, dioctanoyl, diundecyl, didodecyl, dihexadecyl, dioctadecyl. Alkyl gamma hydroxy caproates derived from caprolactone; methyl-γ-hydroxycaproate, ethyl-γ-hydroxycaproate, propyl-γ-hydroxycaproate, butyl-γ-hydroxycaproate, hexyl-γ-hydroxycaproate, octyl-γ-hydroxycaproate, dodecyl-γ-hydroxycaproate, octadecyl-γ-hydroxycaproate, 2-octyl-γ-hydroxycaproate, benzyl-γ-hydroxycaproate, cyclohexyl-γ-hydroxycaproate.

Alcohols: 2-octanol, alkyl cyclohexanols in which the alkyl group has from one to three carbon atoms.

Oxo-Process Alcohols: Mixtures of branched chain alcohols containing various fractions of alcohols distilled from products of the oxo-process. The alcohol fractions contain between 8 and 18 carbon atoms.

Propionitriles (or cyanoethyl alkyl ethers) prepared from alcohols and acrylonitrile; β-methoxy propionitrile, β-ethoxy propionitrile, β-propoxy propionitrile, β-butoxy propionitrile, β-octanoxy propionitrile, β-dodecyloxy propionitrile, β-octadecyloxy propionitrile, β-benzyloxy propionitrile, β-cyclohexyloxy propionitrile.

Carbamates: Alkyl esters of carbamic acid; hexyl carbamate, octyl carbamate, decyl carbamate, dodecyl carbamate, octadecyl carbamate.

The resins and extenders mentioned above merely exemplify the kinds of materials which may be used in the quick-cure compositions of the present invention, and are not meant to constitute a complete list of all possible resins and extenders which may be used for the present purposes. Mixtures of resins, and mixtures of extenders have also been used successfully.

The word "vehicle", as used herein, refers to a solution or uniform dispersion of resin and extender. This vehicle is made by simply heating or melting together the resin or mixture of resins and the extender or mixture of extenders. The mixture is agitated continuously during the mixing, and agitation is continued until a solution or uniform dispersion results. Although the proportions may vary considerably, the preferable weight ratio of total resin to total extender is between about 1:3 and about 3:1, and the most preferable ratio is about 55 parts by weight of resin to about 45 parts by weight of extender.

The concentration of resin in the final composition can be varied either by using more or less of the vehicle, or by using higher or lower concentrations of resin in the vehicle. Therefore, the concentration of resin in the vehicle is more a matter of convenience than an absolute requirement.

In the following Table 1 there are provided a number of different specific vehicles utilizable in the present invention. The components and proportions are merely exemplary and are not intended to provide any specific limitations:

Table 1

| Vehicle # | | % Resin by Weight |
|---|---|---|
| 1 | "MR 85D"/58.3; Tridecanol/41.7 | 58.3 |
| 2 | "MR 97/54.5, Benzyl benzoate/45.5 | 54.5 |
| 3 | "MR 85"/60; Benzyl benzoate/40 | 60.0 |
| 4 | "MR 85D"/60; Benzyl benzoate/40 | 60.0 |
| 5 | "MR 85H"/60; Benzyl benzoate/40 | 60.0 |
| 6 | "MR 85H"/65; N-methyl pyrrolidone/35 | 65.0 |
| 7 | "MR 97"/55; Tridecanol/45 | 55.0 |
| 8 | "MR 85H"/55; Tridecanol/45 | 55.0 |
| 9 | "K 1717"/55; Tridecanol/45 | 55.0 |
| 10 | "K 1717HMP"/55; Tridecanol/45 | 55.0 |
| 11 | "MR 97"/55; Benzyl alcohol/45 | 55.0 |
| 12 | "MR 97"/58.3; Benzyl alcohol/41.7 | 58.3 |
| 13 | "K 1717"/55; Neodol 23/45 | 55.0 |
| 14 | "K 1717 HMP"/55; Neodol 23/45 | 55.0 |
| 15 | "MR 85H"/55; Neodol 23/45 | 55.0 |
| 16 | "MR 97"/55; Methyl laurate/45 | 55.0 |
| 17 | "MR 97"/55; Hexylene glycol/45 | 55.0 |
| 18 | "MR 97"/55; Epoxide #8/45 | 55.0 |
| 19 | "MR 97"/62.5; Epoxide #7/37.5 | 62.5 |
| 20 | "MR 97"/63.6; Lauric aldehyde/36.4 | 63.6 |
| 21 | "MR 97"/55; Methyl myristate/45 | 55.0 |
| 22 | "MR 97"/60; Isopropyl stearate/40 | 60.0 |
| 23 | "MR 97"/63; Epoxide #8/37 | 63 |
| 24 | "MR 97"/67; Epoxide #7/33 | 67 |
| 25 | "MR 97"/55; Tridecanol/45 | 55 |
| 26 | "MR 97"/20; Butyl chlorenisate/80 | 20 |
| 27 | "MR 97"/55; Neodol 23/45 | 55 |
| 28 | "MR 97"/55; Decanol/45 | 55 |
| 29 | "MR 85H"/55; Decanol/45 | 55 |

Butyl chlorenisate is manufactured by Velsicol Chemical Corp., Chicago, Ill.

The cured films of the present invention, without colorants, are clear and visually transparent. Consequently, they can be applied as a protective overlay on previously printed or coated surfaces.

After curing on substrates, the coatings of the present invention may also serve as a surface upon which matter may be printed.

Curing rates may be adjusted to commercially acceptable requirements by the proper choice of the high-energy radiation source, and also by varying the intensity of illumination. The intensity of illumination may be varied by using lamps of varying power output, by using more or fewer lamps, and by raising or lowering the height of the lamps above the web.

When ultraviolet light is used as incident radiation, a workable wave length range is from about 1800 to about 4000 Angstrom Units, but the preferred range is from about 2200 to about 3700 Angstrom Units.

Since the film-forming resins used in the present invention appear to be non-toxic, the quick-cure films may be applied to the surfaces of containers or wrappers which come into contact with edible foods or drinks. For example, they might be applied to wrapping paper, paper board, the inside of metal cans, cartons, and the like.

The following test procedure was followed for the preliminary testing for cure rates of compositions embodying the present invention:

The apparatus used was a conveyor with a variable speed drive of from 10 feet per minute to 1000 feet per minute. The space immediately above the conveyor web was fitted with two medium pressure mercury 12 inch lamps, one capable of 200 watts per linear inch, the other capable of 300 watts per linear inch. The lamps were enclosed in eliptical reflectors. The ensemble was capable of adjustment from 4 inches to 8 inches above the web.

For testing purposes, the conveyor speed was set at 300 feet per minute, and the reflectors were set at four inches above the web. Both lamps were set at 200 watts. It is estimated that these conditions are equivalent to a commercial installation that is capable of curing such compositions when the throughput is a rate of over 700 feet per minute.

All tests were performed on newsprint and/or coated stock. The compositions to be tested were applied with a draw down knife to the surface of the substrate. Panels of coated substrate were run through the conveyor under the lamp as often as necessary until the film on the substrate was cured. The films were considered as cured if they could no longer be smeared when rubbed as hard as possible with the finger.

The rate of cure was expressed by a number which reflected the number of passes required to cure the film. The fewer the number of passes required for curing, the faster the cure rate.

It is to be noted that the tests performed by the method described above are more stringent than the method generally used in the printing industry. Furthermore, many films that were not completely cured in one pass using the present test method would be completely cured in one pass in the more efficient commercial installations. In this respect, it has been found that increasing the intensity of the curing illumination increases the rate of cure. For example, many of the slower curing inks which required as many as two or three passes through the test equipment described above, cured in one pass when the number of radiating lamps was tripled or quadrupled. In fact, it appears that any appropriate composition may be cured in one pass if the number of ultraviolet lamps is sufficiently increased.

Since all of the vehicles described above were quick-cured in only one pass by the described test method, the same test method and equipment was used to test the relative, cure rates of various compositions containing colorants and other additives. In this respect, it was found that the addition of colorants and other additives often required a concentration of one or more extenders and that this concentration was not identical to the optimum concentration when no additives were present. Consequently, the number of passes needed to effect complete cure was often more than one, and in some cases as many as two or three. Nevertheless, none of the compositions tested failed to cure when the number of ultraviolet lamps was increased, and/or the throughput was reduced.

The following table shows the cure-speeds of the vehicles described in Table 1. The cure rate is reflected in the number of passes that a panel of substrate must undergo before complete cure is effected:

Table 2

Substrates: Newsprint and Coated Stock

| Vehicle # | Number of Passes for Complete Cure |
| --- | --- |
| 1 | 1 |
| 2 | 1 |
| 3 | 1 |
| 4 | 1 |
| 5 | 1 |
| 6 | 1 |
| 7 | 1 |
| 8 | 1 |
| 9 | 1 |
| 10 | 1 |
| 11 | 1 |
| 12 | 1 |
| 13 | 1 |
| 14 | 1 |
| 15 | 1 |
| 16 | 1 |
| 17 | 1 |
| 18 | 1 |
| 19 | 1 |
| 20 | 1 |
| 21 | 1 |
| 22 | 1 |
| 23 | 1 |
| 24 | 1 |
| 25 | 1 |
| 26 | 1 |
| 27 | 1 |
| 28 | 1 |
| 29 | 1 |

Colorants may be formulated together with the vehicles to form colored films or inks. With regard to the preparation of inks, the following procedure was used as an example:

EXAMPLE 1

The vehicle, with or without initiators, was placed in a container fitted with a high speed disperser (manufactured by Morehouse Industries, Fullerton, Calif.).

The dry colorants and other additives were added slowly while the mixture was being agitated. After all of the dry additives were admixed, the components were subjected to continuous agitation by the high speed disperser until a fine paste was obtained, and the solid particles were judged to be sufficiently "wetted".

The paste was thereafter ground on a three-roll mill (manufactured by Thropp Div., Paxson Machine Co., Salem, Oh.) for a sufficient number of passes (usually two or three) to obtain a fine smooth dispersion.

The following curable formulations were prepared, the parts by weight of each component being shown for each composition. Each composition contains one or more slip agents, such slip agents being represented by (a) "Micro Poly" (micronized polyethylene), (b) micronized "Teflon" (polytetrafluoroethylene), (c) talc, (d) silica aerogel, and (e) silicone oil; it being understood, however, that these are merely illustrative and that other slip agents may be used. In addition, each composition contains one or more colorants.

Colorants may be present in the final composition at concentrations of as high as 60% (see Composition R). The lowest limits of concentration depends entirely on the intensity of the shade of the colorant, and the shade that is to be achieved in the cured film, and may be as low as about 1%. Generally, concentrations of about 5% to 25% of colorant will be adequate.

The concentration of "slip" agents to be added to the final composition depends to a large extent on the "slip" supplied by the other components, and on the requirements of the machine (i.e.; printing press) that applies the composition to the substrate. In general, 0% (see Composition R) to about 10% will cover most uses, although concentrations as high as 50% have been used successfully.

The molecular weight of the micronized polyethylene used in these formulations was from about 300 to about 2300, using vapor phase osmotic pressure methods but there appears to be no reason why other molecular weight materials cannot be used.

The molecular weight of the micronized teflon used in these formulations was about from 10 million to about 100 million but there appears to be no reason why other molecular weight materials cannot be used.

The vehicles are indicated by their numbers in Table 1:

| Composition A | |
|---|---|
| Vehicle #7 | 74 |
| Decanol | 5 |
| Micro Poly | 1 |
| Talc | 1 |
| Milori Blue | 4 |
| Regal 400R | 15 |
| | 100 |

Milori Blue is marked by C. A. Withington Co., Pelham Manor, N.Y.; and Regal 400R is manufactured by Cabot Corp., Boston, Mass.

| Composition B | |
|---|---|
| Vehicle #25 | 77 |
| Micro Poly | 1 |
| Talc | 1 |
| Silica Aerogel | 2 |
| Milori Blue | 4 |
| Regal 400R | 15 |
| | 100 |

| Composition C | |
|---|---|
| Vehicle #25 | 80 |
| Micro Poly | 1 |
| Talc | 1 |
| Silica Aerogel | 2 |
| R/S Syan | 16 |
| | 100 |

| Composition D | |
|---|---|
| Vehicle #24 | 74 |
| Epoxide #7 | 2 |
| Micro Poly | 5 |
| Milori Blue | 4 |
| Regal 400R | 15 |
| | 100 |

| Composition E | |
|---|---|
| Vehicle #16 | 75 |
| Methyl Laurate | 2 |
| Silica Aerogel | 2 |
| Micro Poly | 1 |
| Talc | 1 |
| Milori Blue | 4 |
| Regal 400R | 15 |
| | 100 |

| Composition F | |
|---|---|
| Vehicle #3 | 85.2 |
| Micro Poly | 1 |
| Benzidine Yellow | 13 |

-continued

| | |
|---|---|
| Red Lake C Base | 0.8 |
| | 100.0 |

| Composition G | |
|---|---|
| Vehicle #11 | 89 |
| Micro Poly | 1 |
| G/S Syan | 10 |
| | 100 |

| Composition H | |
|---|---|
| Vehicle #15 | 91.5 |
| Micro Poly | 1.0 |
| Naphthol Red | 7.5 |
| | 100.0 |

| Composition I | |
|---|---|
| Vehicle #21 | 77 |
| Micro Poly | 1 |
| Red Lake C | 22 |
| | 100 |

| Composition J | |
|---|---|
| Vehicle #22 | 49 |
| Micro Poly | 1 |
| Titanium Dioxide | 50 |
| | 100 |

| Composition K | |
|---|---|
| Vehicle #17 | 79.5 |
| Micronized Teflon | 2.0 |
| Red Lake C | 15.0 |
| Lithol Rubine | 3.0 |
| Silica Aerogel | 0.5 |
| | 100.0 |

| Composition L | |
|---|---|
| Vehicle #9 | 80 |
| Benzidine Yellow | 20 |
| | 100 |

| Composition M | |
|---|---|
| Vehicle #10 | 80 |
| Lithol Rubine | 20 |
| | 100 |

| Composition N | |
|---|---|
| Vehicle #2 | 79 |
| Micro Poly | 1 |
| Rhodamine Red | 20 |
| | 100 |

| Composition O | |
|---|---|
| Vehicle #4 | 79 |
| Micro Poly | 1 |
| Rhodamine Red | 20 |
| | 100 |

| Composition P | |
|---|---|
| Vehicle #8 | 79.5 |
| Micronized Teflon | 2.0 |
| Red Lake C | 15.0 |
| Lithol Rubine | 3.0 |
| Silica Aerogel | 0.5 |
| | 100.0 |

| Composition Q | |
|---|---|
| Vehicle #16 | 79 |
| Micro Poly | 1 |
| G/S Syan | 20 |
| | 100 |

| Composition R | |
|---|---|
| Vehicle #12 | 40 |
| Moly Orange | 60 |
| | 100 |

| Composition S | |
|---|---|
| Vehicle #7 | 79 |
| Micronized Teflon | 2 |
| Red Lake C | 15 |
| Lithol Rubine | 4 |
| | 100 |

| Composition T | |
|---|---|
| Vehicle #25 | 82 |
| Micro Poly | 2 |
| Naphthol Red | 5 |
| Silicone Oil (100 cps.) | 1 |
| | 100 |

| Composition U | |
|---|---|
| Vehicle #28 | 77 |
| Micro Poly | 1 |
| Talc | 1 |
| Silica Aerogel | 2 |
| Milori Blue | 4 |
| Regal 400R | 15 |
| | 100 |

| Composition V | |
|---|---|
| Vehicle #29 | 80 |
| Micro Poly | 1 |
| Milori Blue | 4 |
| Regal 400R | 15 |
| | 100 |

The cure rate of compositions with colorants is illustrated in the following table:

Table 3

| Substrates: Newsprint and/or Coated Stock | |
|---|---|
| Composition | Number of Passes for Complete Cure |
| A | 1 |
| B | 2 |
| C | 2 |
| D | 1 |
| E | 1 |
| F | 1 |
| G | 1 |
| H | 2 |
| I | 1 |
| J | 2 |
| K | 1 |
| L | 1 |
| M | 2 |
| N | 1 |
| O | 1 |
| P | 1 |
| Q | 1 |
| R | 1 |
| S | 1 |
| T | 1 |
| U | 1 |
| V | 1 |

Compositions B and C, among the slowest curing compositions with no photo-initiator, were given commercial trials as printing inks on newsprint, using a "Timson 30" 2/2 Web Offset press with two mercury lamps of 200 watts per linear inch. The press speed was set at 20,000 impressions per hour (I.P.H.), equivalent to a throughput of 700 feet per minute. The printed matter was cured in one pass.

The same compositions on newsprint tested on laboratory equipment containing two mercury lamps, with a throughput of 300 feet per minute, cured in two passes.

Many compositions with colorants were tested on commercial presses, both lithographic and letter presses. All of the compositions were cured after one pass on both newsprint and coated stock.

Following is a description of the press used, and the composition (ink) that was used in each press:

```
Lithography
Heidelberg Model K O R D 2/4
Sheet Offset Press
1 Lamp
Compositions N, S, T.
Hantshcho - 4/4
38" Web Offset Press
3 Lamps
Compositions U, V.
Timson 2/2
30" Web Offset Press
2 Lamps
Compositions A, B, C, S, M.
```

```
Letter Press
Hess and Barker
4 Color Letter Press
Sheet Fed
Compositions M, N.
Heidelberg Model K O R D
Sheet Fed Offset Press
Dry Offset
1 Lamp
Compositions N, S, T.
```

The commercial presses were set to deliver the compositions so that they would cure to a film thickness of between 0.0002 inch and 0.0004 inch, the preferred film thickness being between 0.0002 inch and 0.0003 inch.

Although the quick-cure compositions of the present invention require no photo-initiators, such photo-initiators may, if desired, be included in the compositions as additives. In some formulations the photo-initiator has a negative catalytic effect, in other formulations its inclusion has a positive catalytic effect, while in yet other formulations it has no effect at all on the cure rate.

The photo-initiators used in these tests were benzophenone and/or Michler's Ketone. These initiators, it is to be understood, however, are only representative of the very large number of such materials that may be used for the intended purpose.

Formulations containing such photo-initiators, are represented by the following:

| Formulation I | |
|---|---|
| Vehicle #2 | 56 |
| Benzophenone | 4 |
| Michler's Ketone | 2 |
| Triphenyl Phosphine | 2 |
| Benzyl Benzoate | 15 |
| Micro Poly | 1 |
| Syan Blue Base | 5 |
| Mogul L | 15 |
| | 100 |

| Formulation II | |
|---|---|
| Vehicle #4 | 60 |
| Benzyl Benzoate | 5 |
| Benzylphenone | 8 |
| Michler's Ketone | 4 |
| Triphenyl Phosphine | 2 |
| Micronized Teflon | 2 |
| Milori Blue | 4 |
| Mogul L | 15 |
| | 100 |

| Formulation III | |
|---|---|
| Vehicle #1 | 65 |
| Benzophenone | 8 |
| Michler's Ketone | 4 |
| Triphenyl Phosphine | 2 |
| Micronized Teflon | 2 |
| Milori Blue | 4 |
| Mogul L | 15 |
| | 100 |

| Formulation IV | |
|---|---|
| Vehicle #5 | 65 |
| Benzyl Benzoate | 2 |
| Benzophenone | 8 |
| Michler's Ketone | 4 |
| Micro Poly | 1 |
| Talc | 1 |
| Milori Blue | 4 |
| Regal 400R | 15 |
| | 100 |

| Formulation V | |
|---|---|
| Vehicle #8 | 65 |
| Tridecanol | 2 |
| Benzophenone | 8 |
| Michler's Ketone | 4 |
| Micro Poly | 1 |
| Talc | 1 |
| Milori Blue | 4 |
| Regal 400R | 15 |
| | 100 |

| Formulation VI | |
|---|---|
| Vehicle #2 | 67 |
| Benzophenone | 8 |
| Michler's Ketone | 4 |
| Micro Poly | 1 |
| Talc | 1 |
| Milori Blue | 4 |
| Regal 400R | 15 |
| | 100 |

The cure rates of the above compositions containing colorants and photo-initiators are shown as follows:

Table 4

| Formulation | Number of Passes for Complete Cure |
|---|---|
| I | 1 |
| II | 1 |
| III | 1 |
| IV | 1 |
| V | 2 |
| VI | 1 |

The following vehicles with photo-initiators, were also prepared:

| Vehicle 30 | MR 97/55 | Neodol 23/25 | Benzophenone/20 |
|---|---|---|---|
| Vehicle 31 | MR 97/66.7 | Propyl Pelargonate/26.6 | Benzophenone/6.7 |

The cure rates of these vehicles were as follows:

Table 5

| Vehcile # | Number of Passes for Complete Cure |
|---|---|
| 30 | 1 |
| 31 | 1 |

Vehicles 30 and 31 were included in the following compositions:

| Formulation VII | |
|---|---|
| Vehicle #30 | 79 |
| Micro Poly | 1 |
| Talc | 1 |
| Milori Blue | 4 |
| Regal 400R | 15 |
| | 100 |

| Formulation VIII | |
|---|---|
| Vehicle #31 | 70 |
| Propyl Pelargonate | 9 |
| Micro Poly | 1 |
| Talc | 1 |
| Milori Blue | 4 |
| Regal 400R | 15 |
| | 100 |

The cure rates of these compositions were as follows:

Table 6

| Formulation | Number of Passes for Complete Cure |
|---|---|
| VII | 2 |
| VIII | 1 |

As disclosed above, a quick-cure composition may be formulated either by adding all the additives to the simple vehicle without photo-initiators or by adding the other additives to a vehicle which already contains photo-initiators.

We claim:

1. A radiation-curable film-forming vehicle consisting essentially of a radiation-curable film-forming agent consisting of a mixture of (a) a substantially saturated ketone resin having a molecular weight of from about 500 to about 1200 and formed by the condensation of an aldehyde and a cyclic or acyclic ketone and (b) an extender, said ketone resin being present in the mixture in an effective amount to form a radiation-curable film, and said extender being selected from the group consisting of esters, alcohols, aldehydes, nitrogen heterocyclics, epoxides, nitriles, and carbamates.

2. The vehicle of claim 1 wherein the ratio of ketone resin to extender is between about 1:3 and 3:1 parts by weight.

3. The vehicle of claim 1 wherein the ratio of ketone resin to extender is about 55 parts by weight of resin to about 45 parts by weight of extender.

4. The vehicle of claim 1 further consisting of an effective amount of at least one photo-initiator.

5. The vehicle of claim 4 wherein the photo-initiator is selected from the group consisting of benzophenone and Michler's Ketone.

6. A radiation-curable composition comprising the vehicle of claim 1 and at least one coloring agent, said coloring agent being present in an effective amount to color the vehicle.

7. The composition of claim 6 wherein there is included an effective amount to permit smooth application of the composition to a substrate of at least one slip agent.

8. The composition of claim 7 wherein said slip agent is selected from the group consisting of micronized polyethylene, micronized polytetrafluoroethylene, talc, silica aerogel, and silicone oil.

9. The composition of claim 6 wherein there is included an effective amount of at least one photo-initiator.

10. The composition of claim 7 wherein said photo-initiator is selected from the group consisting of benzophenone and Michler's Ketone.

11. A method of imprinting a substrate which comprises (a) applying to said substrate a composition consisting essentially of a substantially saturated ketone resin having a molecular weight of from about 500 to 1200 and formed by the condensation of an aldehyde and a cyclic or acyclic ketone, an extender selected from the group consisting of esters, alcohols, aldehydes, nitrogen heterocyclics, epoxides and nitrites, and a coloring agent, said ketone resin being present in an effective amount to form a cured film when subjected to radiation, said extender being present in an effective amount to homogeneously disperse or solublize said ketone resin, and said coloring agent being present in an effective amount to color the radiation-cured ketone resin, and (b) applying an effective amount of radiation to cure said ketone resin.

12. The method of claim 11 wherein said composition further consists of an effective amount of at least one slip agent to permit smooth application of the composition to the substrate.

13. The method of claim 11 wherein said composition further consists of an effective amount of a photo-initiator.

* * * * *